(12) United States Patent
Kamo et al.

(10) Patent No.: US 11,249,391 B2
(45) Date of Patent: Feb. 15, 2022

(54) EXPOSURE MASK AND MANUFACTURING METHOD OF SAME

(71) Applicant: KIOXIA CORPORATION, Tokyo (JP)

(72) Inventors: Takashi Kamo, Yokohama Kanagawa (JP); Kosuke Takai, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 201 days.

(21) Appl. No.: 15/909,491

(22) Filed: Mar. 1, 2018

(65) Prior Publication Data

US 2019/0086792 A1 Mar. 21, 2019

(30) Foreign Application Priority Data

Sep. 15, 2017 (JP) .............................. JP2017-178227

(51) Int. Cl.
| | | |
|---|---|---|
| *G03F 1/54* | (2012.01) | |
| *G03F 1/00* | (2012.01) | |
| *G03F 1/52* | (2012.01) | |
| *G03F 1/22* | (2012.01) | |
| *G03F 1/24* | (2012.01) | |

(52) U.S. Cl.
CPC .................. *G03F 1/54* (2013.01); *G03F 1/00* (2013.01); *G03F 1/22* (2013.01); *G03F 1/24* (2013.01); *G03F 1/52* (2013.01)

(58) Field of Classification Search
CPC .................. G03F 1/24; G03F 1/54; G03F 1/52
See application file for complete search history.

(56) References Cited

U.S. PATENT DOCUMENTS

| | | | |
|---|---|---|---|
| 8,535,854 B2 | 9/2013 | Kamo | |
| 8,999,612 B2 | 4/2015 | Yamazaki et al. | |
| 9,720,315 B2 | 8/2017 | Hamamoto et al. | |
| 2011/0117479 A1* | 5/2011 | Suga ..................... | B82Y 10/00 430/5 |
| 2014/0170536 A1* | 6/2014 | Fukugami ................ | G03F 1/38 430/5 |
| 2017/0336721 A1 | 11/2017 | Suzuki et al. | |

FOREIGN PATENT DOCUMENTS

| | | |
|---|---|---|
| JP | 2011-129843 A | 6/2011 |
| JP | 2013-229537 A | 11/2013 |
| JP | 5471835 B2 | 4/2014 |
| JP | 2015-133514 A | 7/2015 |
| JP | 2017-207623 A | 11/2017 |

\* cited by examiner

*Primary Examiner* — Daborah Chacko-Davis
(74) *Attorney, Agent, or Firm* — Kim & Stewart LLP

(57) ABSTRACT

An exposure mask includes a substrate, and a plurality of first films and a plurality of second films located alternately over each other over selected portions of the substrate. The exposure mask further includes a third film selectively located over the first and second films. At least one first pattern is located over the substrate and does not include any of the first, second or third films. At least one second pattern is located over the substrate and includes the first and second films and does not include the third film. At least one third pattern is located over the substrate and includes the first, second and third films.

16 Claims, 8 Drawing Sheets

EXPOSURE MASK AND MANUFACTURING METHOD OF SAME

CROSS-REFERENCE TO RELATED APPLICATION

This application is based upon and claims the benefit of priority from Japanese Patent Application No. 2017-178227, filed Sep. 15, 2017, the entire contents of which are incorporated herein by reference.

FIELD

Embodiments described herein relate generally to an exposure mask and a manufacturing method of the same.

BACKGROUND

In dual tone development (DTD) technology, a resist film at an intermediate exposure portion is caused to remain by using both positive tone developer and negative tone developer, and thereby a resist pattern having a half pitch is formed. In this case, there is a problem in that it is difficult to manufacture an exposure mask which, in use, allows exposure of a resist on a to be patterned layer with high precision, for example, an exposure which causes a resist pattern having a large area to be formed. Therefore, it is desired that an exposure mask which allows exposure with high precision is realized with a simple configuration.

DETAILED DESCRIPTION

Embodiments provide an exposure mask which causes exposure with high precision to be realized with a simple configuration, and a manufacturing method of the same.

In general, according to one embodiment, an exposure mask includes a substrate, and a plurality of first films and a plurality of second films located alternately over each other over selected portions of the substrate. The exposure mask further includes a third film selectively located over the first and second films. At least one first pattern is located over the substrate and does not include any of the first, second or third films. At least one second pattern is located over the substrate and includes the first and second films and does not include the third film. At least one third pattern is located over the substrate and includes the first, second and third films.

Hereinafter, embodiments will be described with reference to the drawings.

First Embodiment

Figure 1A:
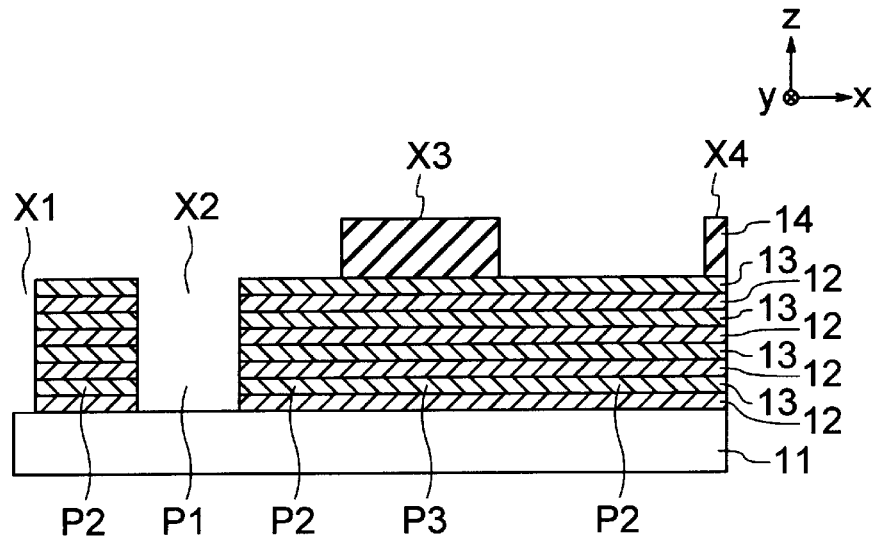
FIGS. 1A and 1B are cross-sectional views illustrating an exposure mask according to a first embodiment.
Figure 1B:
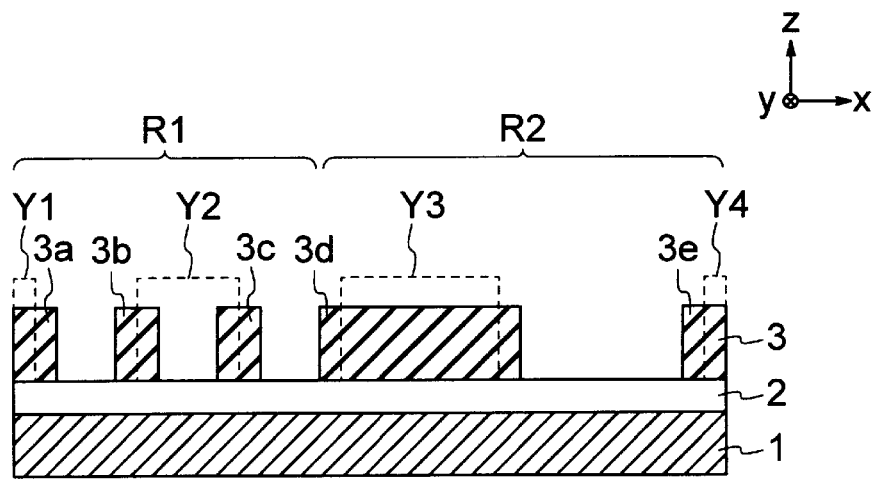

FIGS. 1A and 1B are cross-sectional views illustrating the structure of an exposure mask according to a first embodiment. FIG. 1A is a cross-sectional view illustrating a structure of the exposure mask. FIG. 1B is a cross-sectional view illustrating a resist pattern formed by using the exposure mask to pattern a resist on a substrate.

The exposure mask in the embodiment includes a substrate 11, a plurality of first reflective layers 12 as an example of first films, a plurality of second reflective layers 13 as an example of second films, and an absorber layer 14 as an example of a third film (FIG. 1A). The exposure mask is used in lithography of a resist layer using an electromagnetic wave such as extreme ultra violet (EUV) light. The wavelength of the EUV light is about 13 nm, for example.

As the substrate 11, for example, a low thermal expansion glass substrate is provided. FIG. 1A illustrates an X-direction, a Y-direction, and a Z-direction. The X-direction and the Y-direction are parallel to the surface of the substrate 11 and are perpendicular to each other. The Z-direction is perpendicular to the surface of the substrate 11. In this specification, the +Z direction is set as the up direction and the −Z direction is set as the down direction. The −Z direction may or may not coincide with the gravity direction.

The plurality of first reflective layers 12 and the plurality of second reflective layers 13 have a function of reflecting electromagnetic waves during exposure of a resist layer using the exposure mask, and are alternately stacked one over the other on the mask substrate 11. An example of the first reflective layer 12 is a molybdenum (Mo) layer. The number of first reflective layers 12 is, for example, 40. An example of the second reflective layer 13 is a silicon (Si) layer. The number of second reflective layers 13 is 40, for example.

The absorber layer 14 is a layer having a function of absorbing the electromagnetic waves used for resist exposure, and is formed on the first and second reflective layers 12 and 13. The absorber layer 14 also functions as a hard mask layer when the exposure mask in the embodiment is manufactured. The absorber layer 14 in the embodiment is an inorganic film. For example, the absorber layer 14 is a film which includes a tantalum nitride (TaN) film and/or a tantalum oxide (TaO) film. A protective film (not illustrated) is formed on the top layer among the first and second reflective layers 12 and 13 (here, the uppermost second reflective layer 13). The absorber layer 14 is formed on the top layer and the protective film. The protective film in the embodiment is a metal film, and is a film in which ruthenium (Ru) is provided as the main component, for example. The film thickness of the protective film is 2.5 nm, for example.

The first and second reflective layers 12 and 13 are processed such that portions thereof indicated by the reference signs X1 and X2 are removed, such as by using an ion beam writer. The absorber layer 14 is worked such that portions indicated by the reference signs X3 and X4 remain. As a result, the first reflective layer 12, the second reflective layer 13, and the absorber layer 14 are worked so as to include first to third patterns P1 to P3.

The first pattern P1 is a pattern which does not include the first reflective layer 12, the second reflective layer 13, or the absorber layer 14. The second pattern P2 is a pattern which includes the first reflective layer 12 and the second reflective layer 13, but does not include the absorber layer 14. The third pattern P3 is a pattern which includes the first reflective layer 12, the second reflective layer 13, and the absorber layer 14.

Thus, electromagnetic waves for resist exposure are easily absorbed by the first pattern P1 and are easily reflected by the second pattern P2. That is, regarding reflection of the electromagnetic waves for exposure of a resist on substrate 1, the reflectance thereof by the first pattern P1 is small and the reflectance thereof by the second pattern P2 is large.

The film thickness of the absorber layer 14 is set to cause reflectance of the absorber layer 14 to be equal to about half of the reflectance of the first and second reflective layers 12 and 13. Thus, the reflectance of the third pattern P3 is greater than reflectance of the first pattern P1 and is smaller than reflectance of the second pattern P2. As a result, the exposure mask in the embodiment functions as a tritone mask which includes the first to third patterns P1 to P3 having reflectances for electromagnetic waves, which are different from each other.

FIG. 1B illustrates a substrate 1, a working target layer 2 formed on the substrate 1, and a resist film 3 formed on the working target layer 2. The resist film 3 is worked to obtain resist patterns 3a to 3e. The resist patterns 3a to 3e are formed in a manner that the resist film 3 is exposed by using the exposure mask and the resist film 3 is caused to remain by a series of positive development and negative development of the resist film 3. The remaining resist film 3 is referred to as an intermediate exposure portion.

Portions indicated by the reference signs Y1 to Y4 in FIG. 1B correspond to the portions indicated by the reference signs X1 to X4 of FIG. 1B, respectively. Therefore, the vicinity of the portion (indicated by the reference sign Y1) on the side surface thereof or the vicinity of the portion (indicated by the reference sign Y2) on the side surface thereof function as the intermediate exposure portion, and thus the resist patterns 3a to 3c are formed. The reason is that the intermediate exposure portions receive an influence of both the first pattern P1 and the second pattern P2. In addition, the portion indicated by the reference sign Y3 and the vicinity thereof, or the portion indicated by the reference sign Y4 and the vicinity thereof also function as an intermediate exposure portion, and thus the resist patterns 3d and 3e are formed. The reason is that the intermediate exposure portions receive an influence of the third pattern P3.

FIG. 1B illustrates a form in which working for a memory cell region R1 and a peripheral circuit region R2 of a semiconductor memory device such as a NAND memory is performed. The working target layer 2 is a stacked film for forming a gate insulating film, a charge storage layer, an inter-gate insulating film, and a control electrode. The memory cell region R1 is an example of the first region and the peripheral circuit region R2 is an example of the second region. The resist patterns 3a to 3c are patterns for forming a cell transistor and are an example of the first resist pattern. The resist patterns 3d and 3e are patterns for forming a peripheral transistor, and are an example of the second resist pattern. Thus, density of the resist patterns 3d and 3e is lower than density of the resist patterns 3a to 3c.

As understood from FIGS. 1A and 1B, the resist patterns 3a to 3c are formed from the first and second patterns P1 and P2, and the resist patterns 3d and 3e are formed from the second and the third patterns P2 and P3. Therefore, as illustrated in FIG. 1A, the width of the third pattern P3 (width of X3 or X4) is wider than the width of the first pattern P1 (width of X1 or X2).

Next, the exposure mask in the first embodiment will be specifically described with comparison to first to third comparative examples.

Figure 2A:
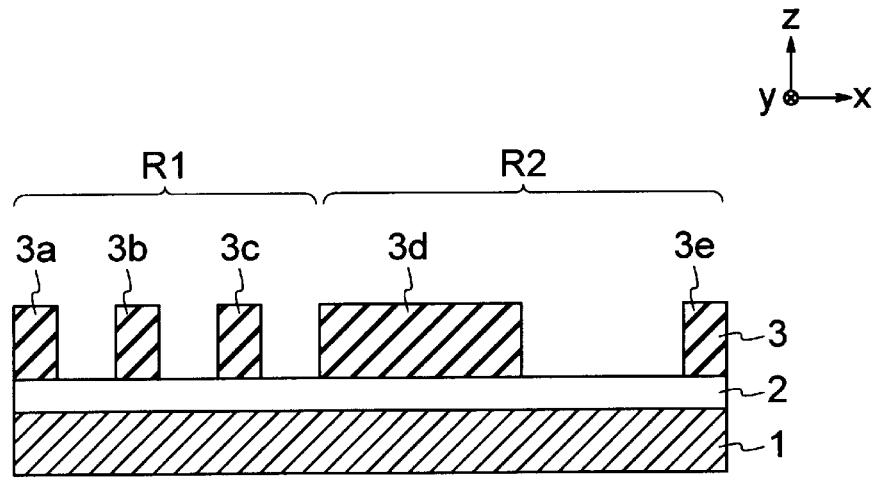
FIGS. 2A, 2B, and 2C are cross-sectional views illustrating an exposure mask in a first comparative example of the first embodiment.
Figure 2B:
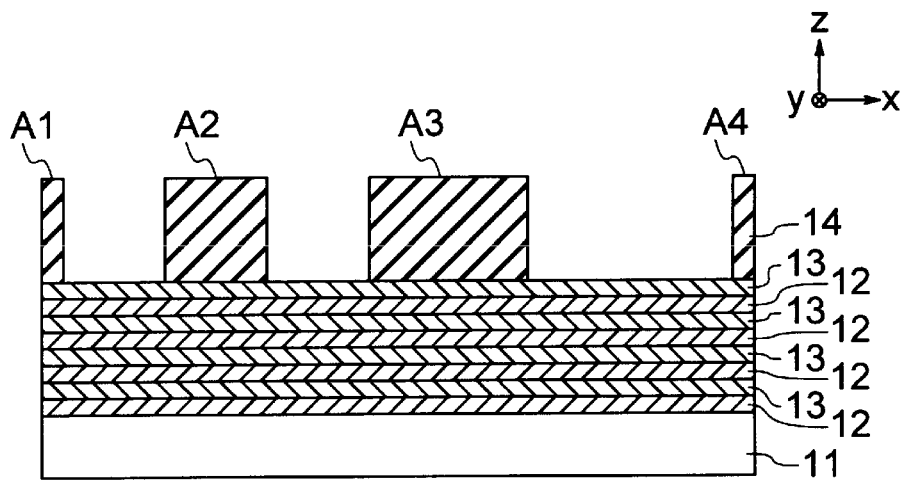
Figure 2C:
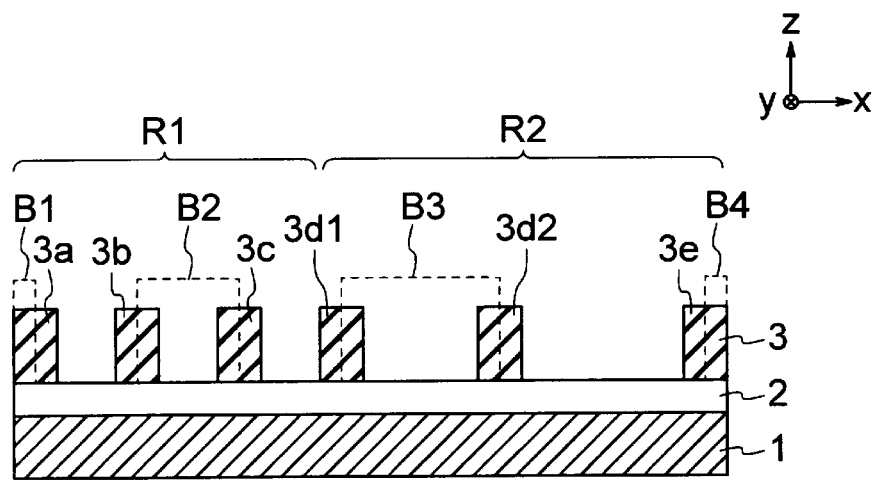

FIGS. 2A to 2C are cross-sectional views illustrating an exposure mask in a first comparative example of the first embodiment.

FIG. 2A illustrates a resist pattern which is desired to be formed by using the exposure mask in the first comparative example. The resist pattern is the same resist pattern as that in FIG. 1B. FIG. 2C illustrates a resist pattern which is practically formed by using the exposure mask in the first comparative example. The resist pattern 3d is divided into resist patterns 3d1 and 3d2.

FIG. 2B illustrates the exposure mask in the first comparative example. The absorber layer 14 is worked so as to cause portions (indicated by the reference signs A1 to A4) to remain. The first and second reflective layers 12 and 13 are not worked.

In FIG. 2C, portions indicated by the reference signs B1 to B4 correspond to the portions indicated by the reference signs A1 to A4, respectively. Therefore, the vicinity of the portions (indicated by the reference signs B1 to B4) on the side surface thereof function as the intermediate exposure portion, and thus the resist patterns 3a to 3e are formed. The reason is because the intermediate exposure portions receive an influence of both a pattern including the absorber layer 14 and a pattern which does not include the absorber layer 14.

In the first comparative example, a resist pattern having a large area of resist (3d of FIG. 1b) does not remain. FIG. 2C illustrates a form in which the center portion of the resist pattern 3d having a large area does not remain and thus the resist pattern 3d is divided into the resist patterns 3d1 and 3d2. The reason is because the center portion receives an influence of only the pattern including the absorber layer 14. Therefore, it is desired to improve the exposure mask in the first comparative example.

Figure 3A:
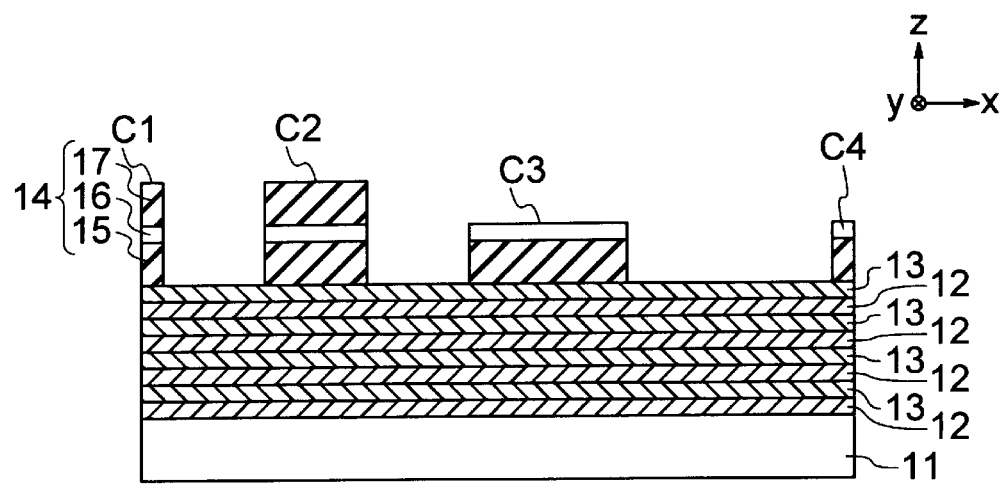
FIGS. 3A and 3B are cross-sectional views illustrating an exposure mask in a second comparative example of the first embodiment.
Figure 3B:
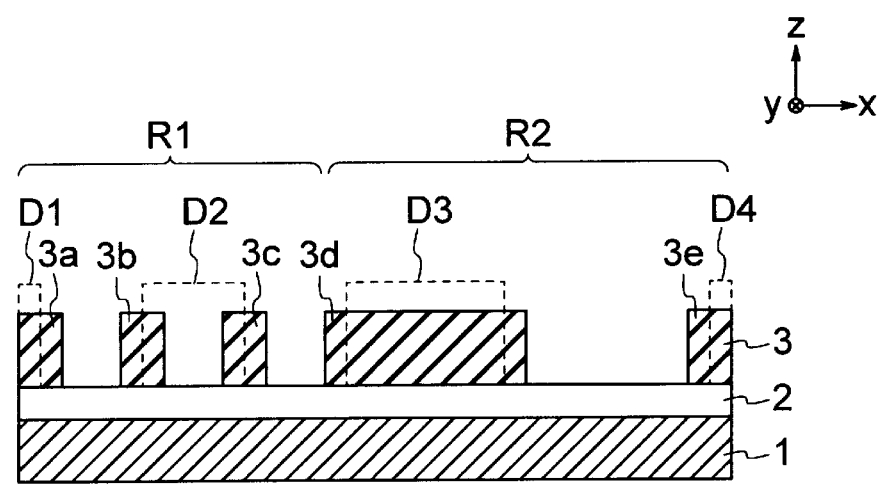

FIGS. 3A and 3B are cross-sectional views illustrating an exposure mask in a second comparative example of the first embodiment.

FIG. 3A illustrates the exposure mask in the second comparative example. The absorber layer 14 is worked so as to cause portions (indicated by the reference signs C1 to C4) to remain. The first and second reflective layers 12 and 13 are not worked. Portions indicated by the reference signs C1 and C2 include a lower absorber layer 15, a stopper layer 16, and an upper absorber layer 17. Portions indicated by the reference signs C3 and C4 include only the lower absorber layer 15 and the stopper layer 16. The stopper layer 16 is used as an etch stop layer when the upper absorber layer 17 is removed from the portions indicated by the reference signs C3 and C4 by etching.

In FIG. 3B, portions of a patterned resist layer indicated by the reference signs D1 to D4 correspond to the portions indicated by the reference signs C1 to C4, respectively. Here, it is noted that the center portion of the resist pattern 3d having a large area remains. The reason is because the center portion receives an influence of only the pattern including the absorber layer 14, and this influenced pattern is thinned in the x-direction. As described above, the exposure mask in the second comparative example can form a desired resist pattern. However, it is necessary that the stopper layer 16 for forming a region in which the film thickness of the absorber layer 14 is thin (layer 15 and stopper layer 16 only) and a region in which the film thickness of the absorber layer 14 is thick (layers 15 and 17 and stopper layer 16) is provided. Therefore, there is a problem in that it is difficult to manufacture a desired exposure mask because of, for example, an increase in the number of manufacturing processes of the exposure mask or a change in performance thereof.

Figure 4A:
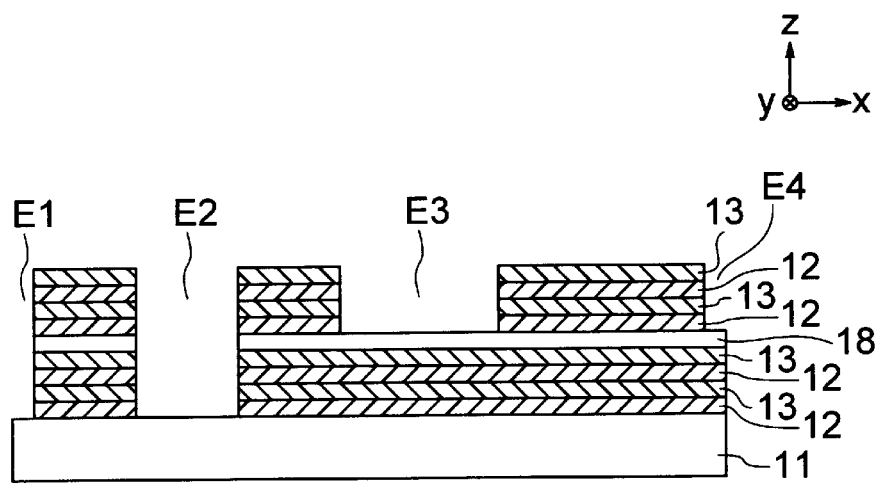
FIGS. 4A and 4B are cross-sectional views illustrating an exposure mask in a third comparative example of the first embodiment.
Figure 4B:
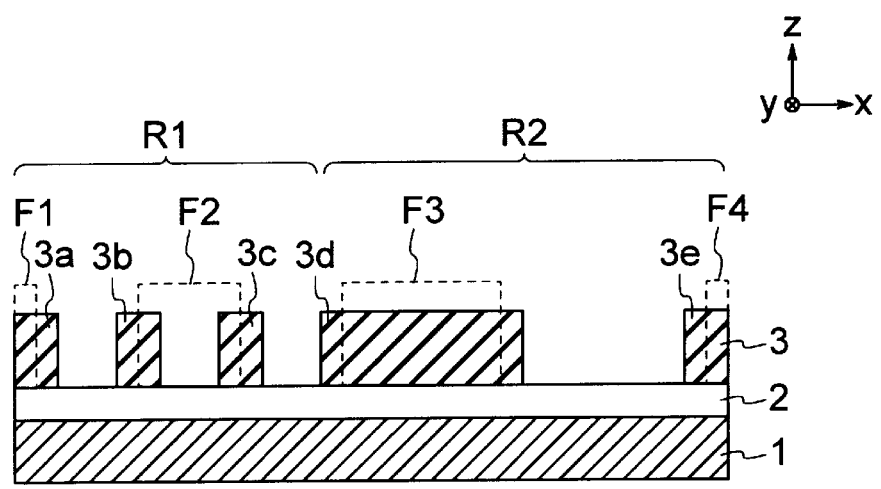

FIGS. 4A and 4B are cross-sectional views illustrating an exposure mask in a third comparative example of the first embodiment.

FIG. 4A illustrates the exposure mask in the third comparative example. The exposure mask in the third comparative example does not include the absorber layer 14, and includes a stopper layer 18 in a stacked body of the first and second reflective layers 12 and 13. The first and second reflective layers 12 and 13 are worked so as to remove portions thereof indicated by the reference signs E1 to E4. The portions indicated by the reference signs E1 and E2 do not include the first and second reflective layers 12 and 13 or the stopper layer 18. The portions indicated by the reference signs E3 and E4 include a stopper layer 18 and a portion of the first and second reflective layers 12 and 13. The stopper layer 18 is used as an etching stopper when the portions of the first and second reflective layers 12 and 13 are removed from the portions indicated by the reference signs E3 and E4.

In FIG. 4B, portions indicated by the reference signs F1 to F4 correspond to the portions indicated by the reference signs E1 to E4, respectively. Here, it is noted that the center portion of the resist pattern 3d having a large area remains. The reason is because the center portion receives an influence of only the pattern including the first and second reflective layers 12 and 13, and this influenced pattern is thinned in the x-direction. As described above, the exposure mask in the third comparative example can form a desired resist pattern having the large area remaining. However, it is necessary that the stopper layer 18 for forming a region in which the number of the stacked first and second reflective layers 12 and 13 is large and a region in which the number of the stacked first and second reflective layers 12 and 13 is small be provided. Therefore, there is a problem in that it is difficult to manufacture a desired exposure mask because of, for example, an increase in the number of manufacturing processes of the exposure mask or a change in performance thereof.

The exposure mask in the first embodiment results in the center portion of the resist pattern 3d having a large area remaining without including the stopper layer 16 or the stopper layer 18. Thus, according to the first embodiment, it is possible to simply manufacture a desired exposure mask.

FIGS. 5A to 7C are cross-sectional views illustrating a manufacturing method of the exposure mask in the first embodiment.

Figure 5A:
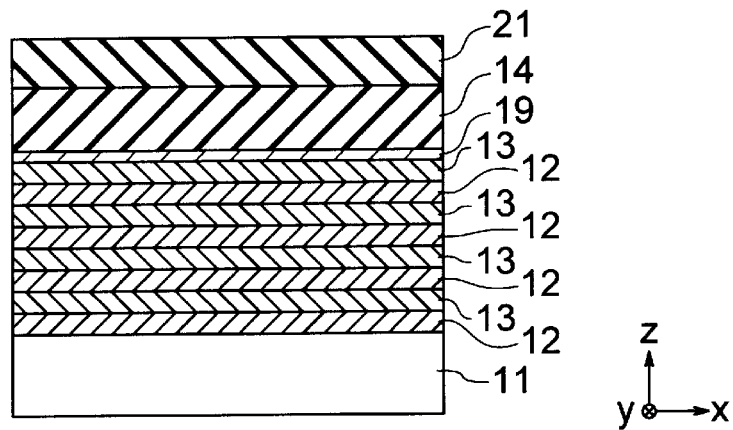
FIGS. 5A, 5B, and 5C are cross-sectional views (1/3) illustrating a manufacturing method of the exposure mask in the first embodiment.

Firstly, a plurality of first reflective layers 12 and a plurality of second reflective layers 13 are alternately formed on a substrate 11 (FIG. 5A). Then, a protective film 19, an absorber layer 14, and a resist film 21 are sequentially formed on the first and second reflective layers 12 and 13 (FIG. 5A). In this manner, an EUV mask blank is prepared. As an example of the protective film 19, a metal film in which Ru is used as the main component is provided. As an example of the absorber layer 14, an inorganic film which allows the first reflective layer 12, the second reflective layer 13, and the protective film 19 to be selectively etched is provided. As an example of the resist film 21, a chemically amplified positive resist film for electron beam pattern drawing thereon is provided.

Figure 5B:
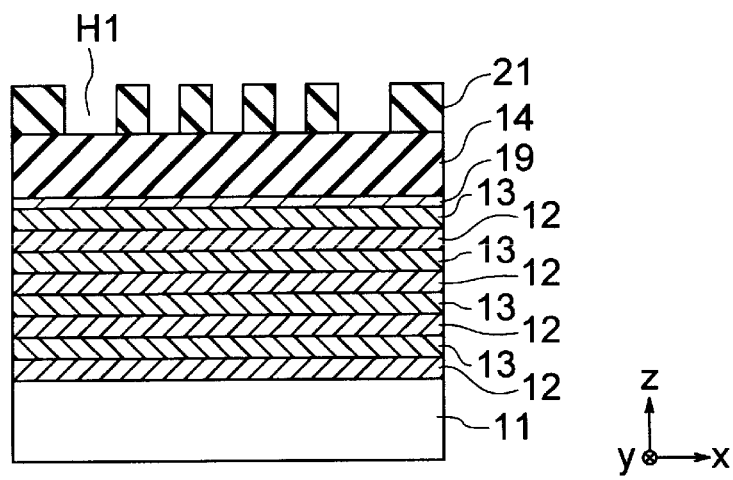
Figure 5C:
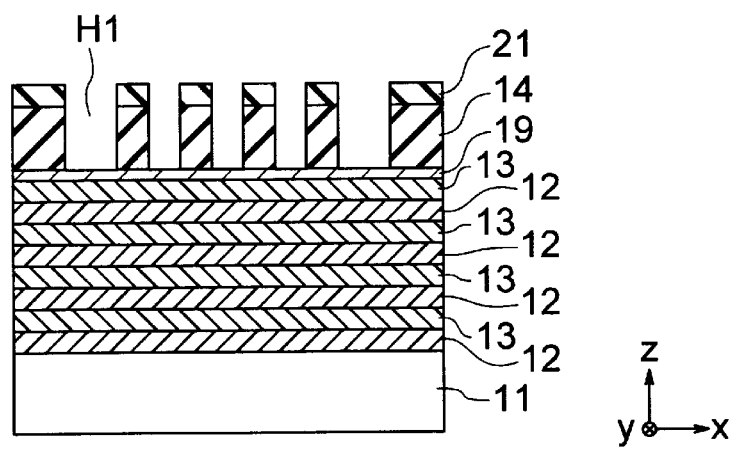
Figure 6A:
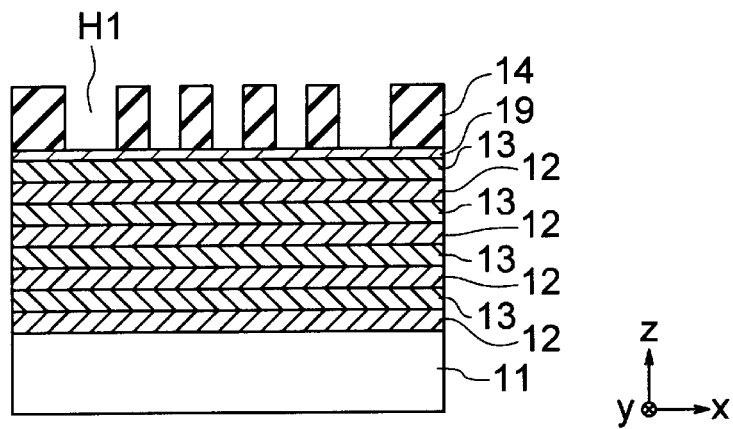
FIGS. 6A, 6B, and 6C are cross-sectional views (2/3) illustrating the manufacturing method of the exposure mask in the first embodiment.

Then, a plurality of first opening portions H1 are formed in the resist film 21 by lithography using an electron beam (FIG. 5B). The absorber layer 14 is etched by using the resist film 21 as a mask, and thus the first opening portion H1 reaches the protective film 19 (FIG. 5C). Then, the resist film 21 is removed (FIG. 6A). In this manner, the first opening portions H1 which penetrate the absorber layer 14 are formed.

Figure 6B:
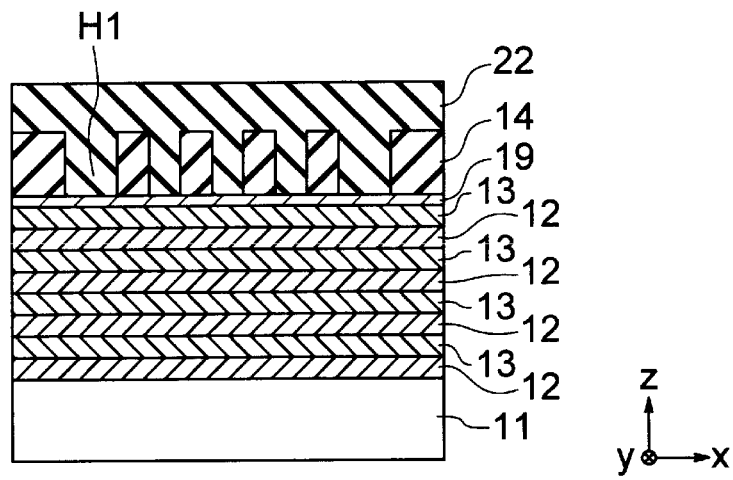

Then, a resist film 22 is formed on the entire surface of the substrate 11 (FIG. 6B). As an example of the resist film 22, a positive resist film for laser drawing thereon is provided.

Figure 6C:
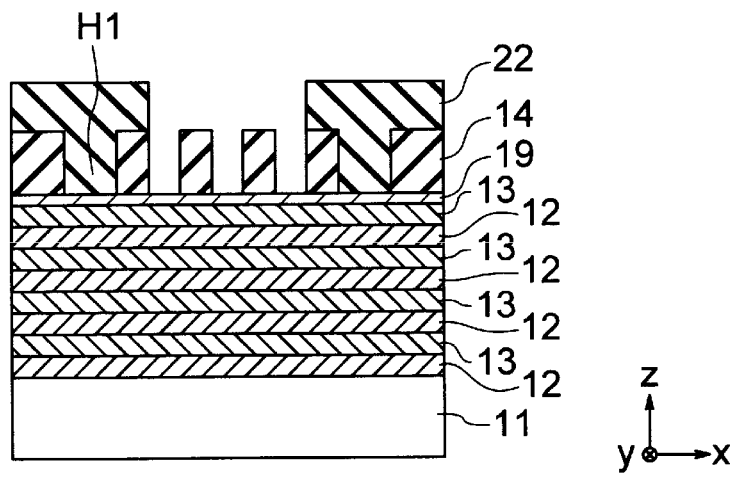
Figure 7A:
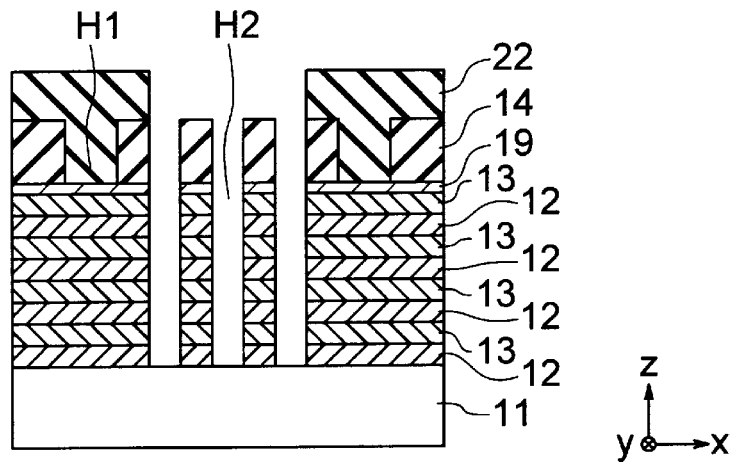
FIGS. 7A, 7B, and 7C are cross-sectional views (3/3) illustrating the manufacturing method of the exposure mask in the first embodiment.
Figure 7B:
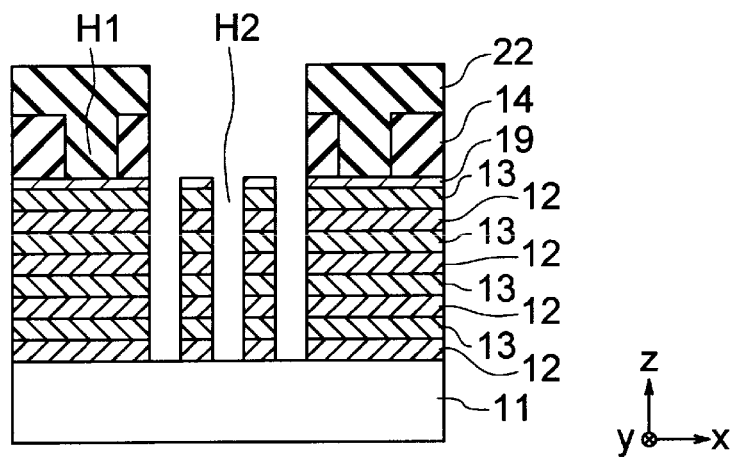
Figure 7C:
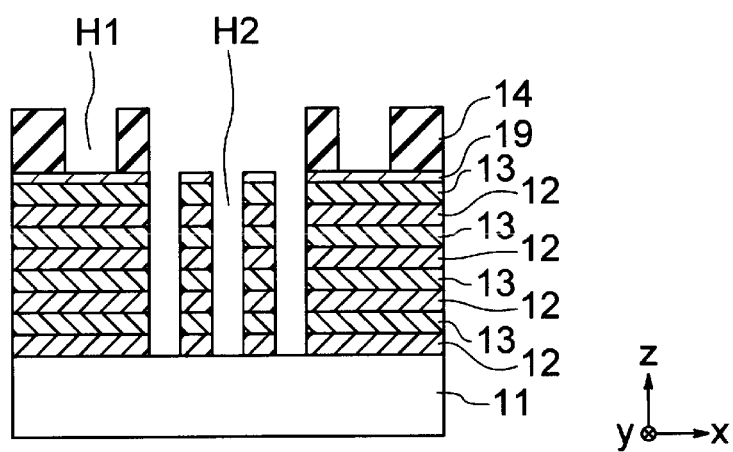

Then, the resist film 22 is removed from some of the first opening portions H1 by lithography using laser to expose a pattern followed by development (FIG. 6C). The protective film 19, the first reflective layer 12, and the second reflective layer 13 in the first opening portion H1 are etched by using the resist film 22 and the absorber layer 14 as a mask (FIG. 7A). As a result, a plurality of second opening portions H2 which penetrate the protective film 19 and the stacked body of the first and second reflective layers 12 and 13 are formed. Then, the absorber layer 14 which is not covered by the resist film 22 is etched and thus removed (FIG. 7B). Then, the resist film 22 is removed (FIG. 7C).

In this manner, the first to third patterns P1 to P3 are formed on the substrate 11, and the exposure mask in FIG. 1A is manufactured.

As described above, the exposure mask in the first embodiment is manufactured so as to include the first pattern P1 (which does not include the first reflective layer 12, the second reflective layer 13, and the absorber layer 14), the second pattern P2 (which includes the first reflective layer 12 and the second reflective layer 13, but does not include the absorber layer 14), and the third pattern P3 (which includes the first reflective layer 12, the second reflective layer 13, and the absorber layer 14).

Thus, according to the first embodiment, it is possible to perform exposure with high precision, for example, exposure which causes a resist pattern having a large area to correctly remain in the exposed and developed resist on the target substrate 1, by using this exposure mask. According to the first embodiment, it is possible to realize an exposure mask which allows exposure with high precision, with a simple configuration. For example, since it is not required that the stopper layer 16 or the stopper layer 18 be formed, it is possible to increase tolerance on a manufacturing process of an exposure mask.

The reflectance of the absorber layer 14 may not be equal to the half of the reflectance of the first and second reflective layers 12 and 13, so long as the reflectance of the absorber layer 14 allows forming of the resist pattern in FIG. 1B. It is considered that, in many cases, precision for exposure is improved because the reflectance of the absorber layer 14 is approximate to the half of the reflectance of the first and second reflective layers 12 and 13. The reflectance of the absorber layer 14 can be adjusted by controlling the film thickness of the absorber layer 14 to a desired film thickness when the absorber layer 14 is formed in the process of FIG. 5A.

Second Embodiment

Figure 8A:
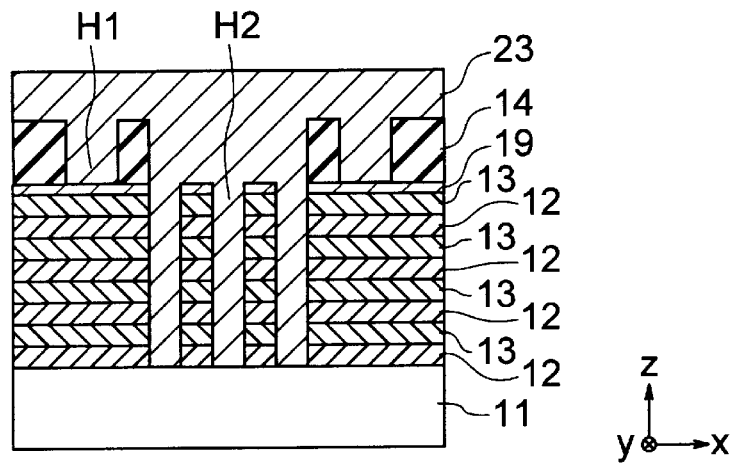
FIGS. 8A, 8B, and 8C are cross-sectional views illustrating a manufacturing method of an exposure mask according to a second embodiment.
Figure 8B:
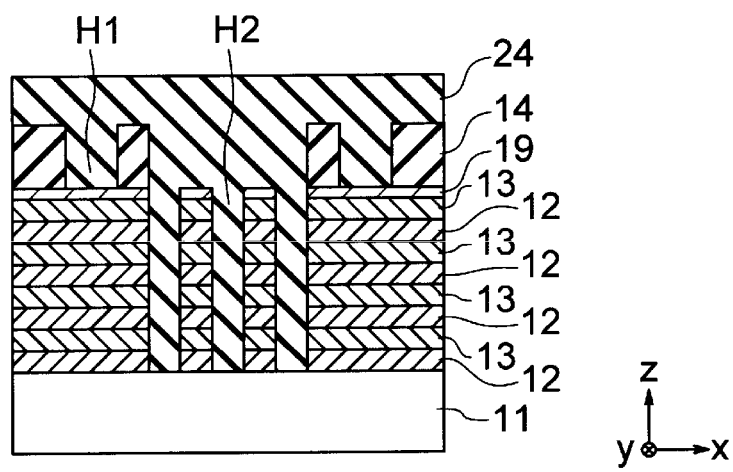
Figure 8C:
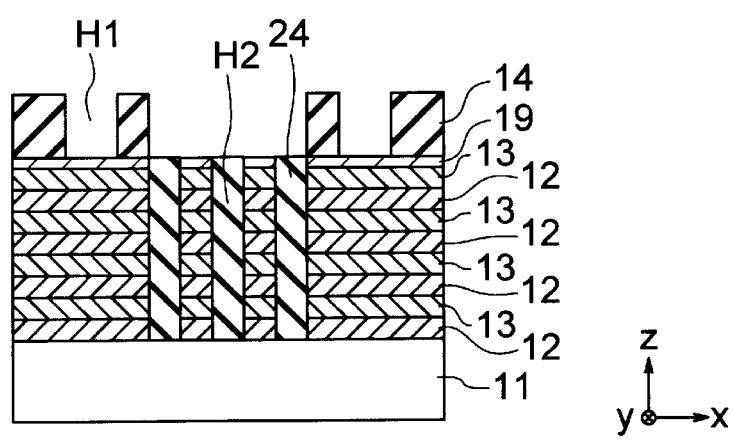

FIGS. 8A to 8C are cross-sectional views illustrating a manufacturing method of an exposure mask according to a second embodiment.

In the second embodiment, after the process of FIG. 7C, a coating film 23 is formed on the entire surface of the substrate 11, and thus the first and second opening portions H1 and H2 are filled with the coating film 23 (FIG. 8A). As an example of the coating film 23, a film containing silicon is provided.

Then, the coating film 23 is baked so as to modify the coating film 23 to an oxide film 24 (FIG. 8B). The coating film 23 is baked, for example, at 150° C. for 24 hours. As an example of the oxide film 24, a silicon oxide film is provided. The oxide film 24 may be an insulating film or a conductive film.

Then, the oxide film 24 is removed from the first opening portion H1 and the like by etching back the oxide film 24 (FIG. 8C). In this manner, an exposure mask in which the second opening portion H2 is filled with the oxide film 24 is manufactured. The oxide film 24 is provided to be adjacent to the stacked body of the first and second reflective layers 12 and 13 on the substrate 11. The first pattern P1 in FIG. 1A includes the oxide film 24. The oxide film 24 is an example of a fourth film.

As described above, the exposure mask in the second embodiment includes the oxide film 24 filled into the second opening portion H2. Thus, according to the second embodiment, it is possible to prevent collapse of the second pattern P2 and the like, by use of the oxide film 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure mask for exposing a resist on a target substrate, the exposure mask comprising:
    a substrate;
    a plurality of first films and a plurality of second films stacked alternately on each other directly on the substrate; and
    a third film selectively located over the first and second films, wherein
    a first pattern is on the substrate, does not include any of the first, second or third films, and exposes the substrate,
    a second pattern is on the substrate and includes the first and second films, but does not include the third film, and
    a third pattern is on the substrate and includes the first, second and third films, wherein
    the first pattern is on a first region of the substrate,
    the second pattern is on both the first region and a second region of the substrate adjacent to the first region,
    the third pattern is on the second region,
    the first region corresponds to a memory cell region on the target substrate, and
    the second region corresponds to a peripheral circuit on the target substrate.

2. The exposure mask according to claim 1, wherein the alternately stacked first and second films reflect light at an extreme ultraviolet wavelength, and
    the third film is an absorber layer configured to absorb the extreme ultraviolet wavelength.

3. The exposure mask according to claim 1, wherein the reflectance of the third pattern at an extreme ultraviolet wavelength is greater than the reflectance of the first pattern at the extreme ultraviolet wavelength, but less than the reflectance of the second pattern at the extreme ultraviolet wavelength.

4. The exposure mask according to claim 1, wherein the second pattern is located on the substrate at a position that is between a position at which the first pattern is located on the substrate and a position at which the third pattern is located on the substrate.

5. The exposure mask according to claim 1, wherein a portion of the second pattern is located between two different portions of the first pattern.

6. The exposure mask according to claim 1, wherein a portion of the third pattern is located between two different portions of the second pattern.

7. The exposure mask according to claim 1, wherein the third pattern is wider than the first pattern.

8. The exposure mask according to claim 1, further comprising:
    a fourth film filling the first pattern.

9. The exposure mask according to claim 1, wherein first pattern is adjacent to and between two different portions of the second pattern.

10. The exposure mask according to claim 1, wherein the third pattern is not directly adjacent to the first pattern.

11. An exposure mask for exposing a resist on a target substrate to form first masking regions and second masking regions on the target substrate, the first masking regions having a first width and the second masking regions having a second width greater than the first width, the exposure mask comprising:
    a glass substrate having a first surface and comprising a first region, a second region, and a third region on the first surface, wherein
    the first region has a first reflectivity;
    the second region has a second reflectivity greater than the first reflectivity,
    the third region has a third reflectivity greater than the first reflectivity, but less than the second reflectivity,
    the second region comprises a stack of alternating first and second layers configured to reflect an extreme ultraviolet wavelength, the stack being directly on the first surface and in direct contact with the glass substrate,
    the third region comprises the stack of alternating first and second layers and a third layer on the stack, the third layer being configured to absorb the extreme ultraviolet wavelength,
    the first region does not include either one of the third layer and the stack of alternating first and second layers; and
    the first region is directly adjacent to the second region.

12. The exposure mask according to claim 11, wherein the third region has a third width in a first direction extending parallel to the first surface of the glass substrate, which is greater than the width of the first region in the first direction.

13. The exposure mask according to claim 11, further comprising:
    a fourth layer in the first region and having a composition different than that of the first, second and third layers.

14. The exposure mask according to claim 11, wherein the first region is between two different portions of the second region.

15. The exposure mask according to claim 11, wherein the first surface is an uppermost surface of the glass substrate.

16. The exposure mask according to claim 11, wherein the third layer is above a position on the substrate that is between positions of two different portions of the second region.

* * * * *